United States Patent
Kondo

(10) Patent No.: US 8,054,138 B2
(45) Date of Patent: Nov. 8, 2011

(54) MULTI-OSCILLATOR CIRCUIT WITH VARIABLE POWER SUPPLY

(75) Inventor: Hideo Kondo, Ora-gun (JP)

(73) Assignee: Semiconductor Components Industries, LLC, Pheonix, AZ (US)

( * ) Notice: Subject to any disclaimer, the term of this patent is extended or adjusted under 35 U.S.C. 154(b) by 40 days.

(21) Appl. No.: 12/694,465

(22) Filed: Jan. 27, 2010

(65) Prior Publication Data

US 2010/0188157 A1    Jul. 29, 2010

(30) Foreign Application Priority Data

Jan. 28, 2009 (JP) .................................. 2009-016646

(51) Int. Cl.
*H03K 3/01* (2006.01)
*H03B 5/30* (2006.01)

(52) U.S. Cl. .............. 331/46; 331/49; 331/55; 331/158; 331/160; 331/185

(58) Field of Classification Search .................... 331/46, 331/47, 49, 55, 154, 158, 160, 185, 186
See application file for complete search history.

(56) References Cited

U.S. PATENT DOCUMENTS

| | | | | |
|---|---|---|---|---|
| 5,325,074 A * | 6/1994 | Suenaga | | 331/46 |
| 5,705,955 A * | 1/1998 | Freeburg et al. | | 331/14 |
| 7,342,465 B2 * | 3/2008 | Seefeldt | | 331/185 |
| 7,414,490 B2 * | 8/2008 | Jeon et al. | | 331/179 |

FOREIGN PATENT DOCUMENTS

| | | |
|---|---|---|
| JP | 9-34867 | 2/1997 |
| JP | 2002-222024 | 8/2002 |

* cited by examiner

*Primary Examiner* — Robert Pascal
*Assistant Examiner* — Levi Gannon
(74) *Attorney, Agent, or Firm* — Morrison & Foerster LLP

(57) ABSTRACT

This invention makes it possible to reduce a power consumption of an electronic circuit (microcomputer, for example) while preventing malfunctioning of an oscillator by appropriately setting a power supply impedance of a low frequency oscillator corresponding to an operation mode. A high frequency oscillator, a medium frequency oscillator and a low frequency oscillator are provided as sources of system clocks. In addition, there is provided a quartz oscillator to generate a clock for a timepiece. When the high frequency oscillator is in operation, a power supply impedance of the quartz oscillator is reduced to improve a noise tolerance. In a waiting period during which the high frequency oscillator, the medium frequency oscillator and the low frequency oscillator are halted, on the other hand, the power supply impedance of the quartz oscillator is increased to suppress the power consumption.

7 Claims, 4 Drawing Sheets

MULTI-OSCILLATOR CIRCUIT WITH VARIABLE POWER SUPPLY

CROSS-REFERENCE OF THE INVENTION

This application claims priority from Japanese Patent Application No. 2009-016646, the content of which is incorporated herein by reference in its entirety.

BACKGROUND OF THE INVENTION

1. Field of the Invention

This invention relates to an electronic circuit, specifically to an electronic circuit having a plurality of oscillators different in oscillation frequency from each other.

2. Description of the Related Art

A conventional microcomputer is provided with a system clock oscillator that generates a clock (system clock or the like) for operations of internal circuits such as a CPU (Central Processing Unit) and a timepiece oscillator that generates a clock for a timepiece. In general, the timepiece oscillator is formed of a quartz oscillator and generates a clock of a low frequency (32 KHz, for example) compared with a frequency of the clock generated by the system clock oscillator.

The microcomputer generally has a plurality of operation modes that differs in processing speed from each other, and has a plurality of system clock oscillators that generates clocks different in speed (frequency), each corresponding to each of the operation modes, respectively. That is, a high speed (high frequency) system clock oscillator is put into operation to generate a high frequency clock in a high speed operation mode, while a low speed (low frequency) system clock oscillator is put into operation to generate a low frequency clock in a low speed operation mode.

When the microcomputer is in operation, one of the system clock oscillators and the timepiece oscillator are in operation simultaneously. When the microcomputer is in a waiting period such as a standby period, on the other hand, all the system clock oscillators are halted while only the timepiece oscillator is in operation. In this case, a power supply impedance of the timepiece oscillator is set to be high so that a power consumption of the microcomputer during the waiting period is suppressed.

This kind of microcomputers is described in Japanese Patent Application Publication Nos. 2002-222024 and H09-034867, for example.

When the power supply impedance of the timepiece oscillator is set to be high, however, there is caused a problem that the timepiece would malfunction since a noise caused from the high frequency system clock oscillator is so large in the high speed operation mode to exert an influence on the clock generated by the timepiece oscillator. When the power supply impedance of the timepiece oscillator is set to be low as a countermeasure against the noise, on the other hand, there is caused another problem that the power consumption of the microcomputer is increased.

SUMMARY OF THE INVENTION

The invention provides an electronic circuit that includes a first oscillator generating a first clock. A power supply impedance of the first oscillator is configured to be variable and controllable. The circuit also includes a second oscillator generating a second clock. A frequency of the second clock is higher than a frequency of the first clock. The circuit further includes a control circuit setting the power supply impedance of the first oscillator to a high impedance when the second oscillator is halted and setting the power supply impedance of the first oscillator to a low impedance when the second oscillator is in operation.

The invention also provides an electronic circuit that includes a first oscillator generating a first clock. A power supply impedance of the first oscillator is configured to be variable and controllable. The circuit also includes a second oscillator generating a second clock. A frequency of the second clock is higher than a frequency of the first clock. The circuit further includes a third oscillator generating a third clock. A frequency of the third clock is higher than the frequency of the second clock. The circuit also includes a control circuit setting the power supply impedance of the first oscillation circuit to a high impedance when the second and the third oscillators are halted, setting the power supply impedance of the first oscillator to a medium impedance when the second oscillator is in operation and the third oscillator is halted, and setting the power supply impedance of the first oscillator to a low impedance when the third oscillator is in operation and the second oscillator is halted.

DETAILED DESCRIPTION OF THE INVENTION

A microcomputer according to an embodiment of this invention will be described referring to FIGS. 1 through 4. First, an overall structure of the microcomputer will be described referring to FIG. 1.

Figure 1:
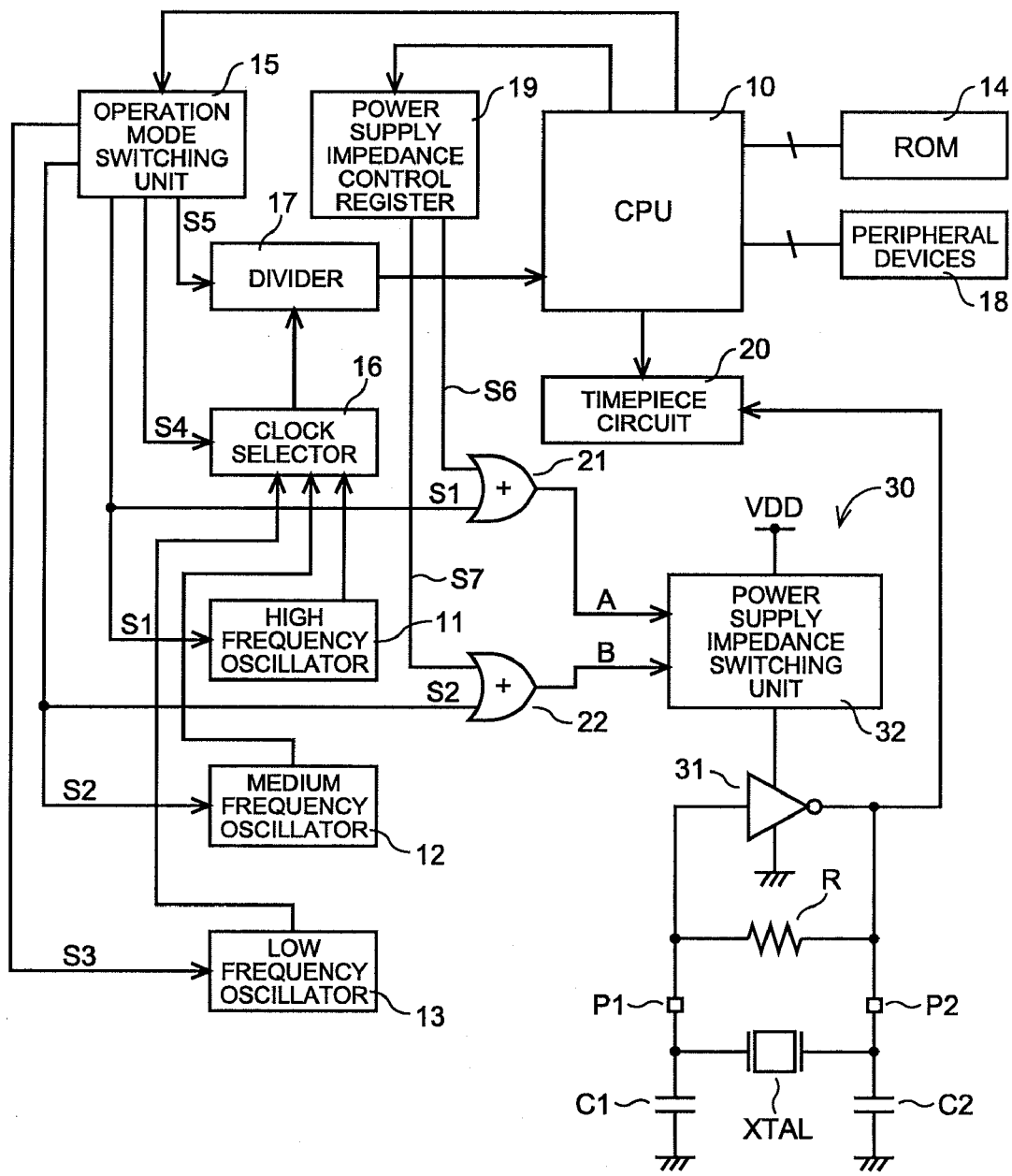
FIG. 1 is a circuit diagram of a microcomputer according to an embodiment of this invention.

A high frequency oscillator 11 that generates a high frequency clock (8 MHz, for example), a medium frequency oscillator 12 that generates a medium frequency clock (4 MHz, for example) and a low frequency oscillator 13 that generates a low frequency clock (1 MHz, for example) are provided as sources of system clocks, as shown in FIG. 1. Each of the three oscillators 11, 12 and 13 is an RC oscillator that is formed including a resistor R and a capacitor C, for example.

Starting and halting of the three oscillators 11, 12 and 13 are controlled by a CPU 10. That is, the CPU 10 controls an operation mode switching unit 15 in accordance with a program stored in a ROM (Read Only Memory) 14. The operation mode switching unit 15 outputs corresponding each of control signals S1, S2 and S3 to the high frequency oscillator 11, the medium frequency oscillator 12 or the low frequency oscillator 13, respectively, based on programmed instructions from the CPU 10. That is, the control signal S1 is turned to an H level to put the high frequency oscillator 11 into operation in a high speed operation mode, the control signal S2 is turned to the H level to put the medium frequency oscillator 12 into operation in a medium speed operation mode, and the control signal S3 is turned to the H level to put the low frequency oscillator 13 into operation in a low speed operation mode.

A clock selector 16 selects a clock out of the clocks from the high frequency oscillator 11, the medium frequency oscillator 12 and the low frequency oscillator 13 based on a control signal S4 from the operation mode switching unit 15, and applies the selected clock to a divider 17 in a subsequent stage. The divider 17 divides a frequency of the selected clock by a predetermined dividing factor based on a control signal S5 from the operation mode switching unit 15. A clock with a frequency divided by the divider 17 is used as a system clock to drive the CPU 10 and the like.

In addition to controlling the operation mode switching unit 15, the CPU 10 controls peripheral devices 18, a power supply impedance control register 19, a timepiece circuit 20, a RAM (Random Access Memory, not shown) and the like, according to the program stored in the ROM 14. The peripheral devices 18 include a timer, an A/D converter, an input/output circuit and the like.

A quartz oscillator 30 generates a timepiece clock that is applied to a timepiece circuit 20. The timepiece circuit 20 includes a counter circuit operating based on the timepiece clock and has a timepiece function to count seconds, minutes, hours, days, years and the like. An oscillation frequency of the quartz oscillator 30 is 32 KHz, for example, which is a substantially low frequency compared with the oscillation frequencies of the high frequency clock (8 MHz, for example) of the high frequency oscillator 11, the medium frequency clock (4 MHz, for example) of the medium frequency oscillator 12 and the low frequency clock (1 MHz, for example) of the low frequency oscillator 13.

In the quartz oscillator 30, a quartz resonator XTAL and capacitors C1 and C2 are externally connected to terminals P1 and P2 of the microcomputer, and a resistor R and an inverter 31 (a kind of amplifier) for negative feedback are connected between the terminals P1 and P2. In addition, there is provided a power supply impedance switching unit 32 to switch a power supply impedance of the inverter 31.

The power supply impedance switching unit 32 is controlled to make the switching based on the control signals S1 and S2 from the operation mode switching unit 15 or control signals S6 and S7 from the power supply impedance control register 19. The control signals S1 and S6 are inputted to a first OR circuit 21, while the control signals S2 and S7 are inputted to a second OR circuit 22. The first OR circuit 21 outputs a first impedance control signal A, while the second OR circuit 22 outputs a second impedance control signal B.

When the first impedance control signal A is at the H level, the power supply impedance of the inverter 31 is set to a low impedance. When the second impedance control signal B is at the H level, the power supply impedance of the inverter 31 is set to a medium impedance. When both the first and second impedance control signals A and B are at an L level, the power supply impedance of the inverter 31 is set to a high impedance.

That is, the power supply impedance of the quartz oscillator 30 can be controlled for optimization by switching the operation mode and setting data in the power supply impedance control register 19.

Varying the power supply impedance of the inverter 31, that is a kind of amplifier, is equivalent to varying a gain of the amplifier. That is, reducing the power supply impedance of the inverter 31 is equivalent to reducing the gain, and increasing the power supply impedance of the inverter 31 is equivalent to increasing the gain.

FIG. 1 shows that the power supply impedance switching unit 32 is placed between a power supply electric potential VDD and a power supply terminal of the inverter 31, which is to provide the inverter 31 with the power supply electric potential VDD. Not limited to the above, the power supply impedance switching unit 32 may be placed between a ground electric potential VSS and a ground terminal of the inverter 31, which is to provide the inverter 31 with the ground electric potential VSS, or may be placed both on a side of the power supply electric potential VDD and on a side of the ground electric potential VSS.

Figure 2:
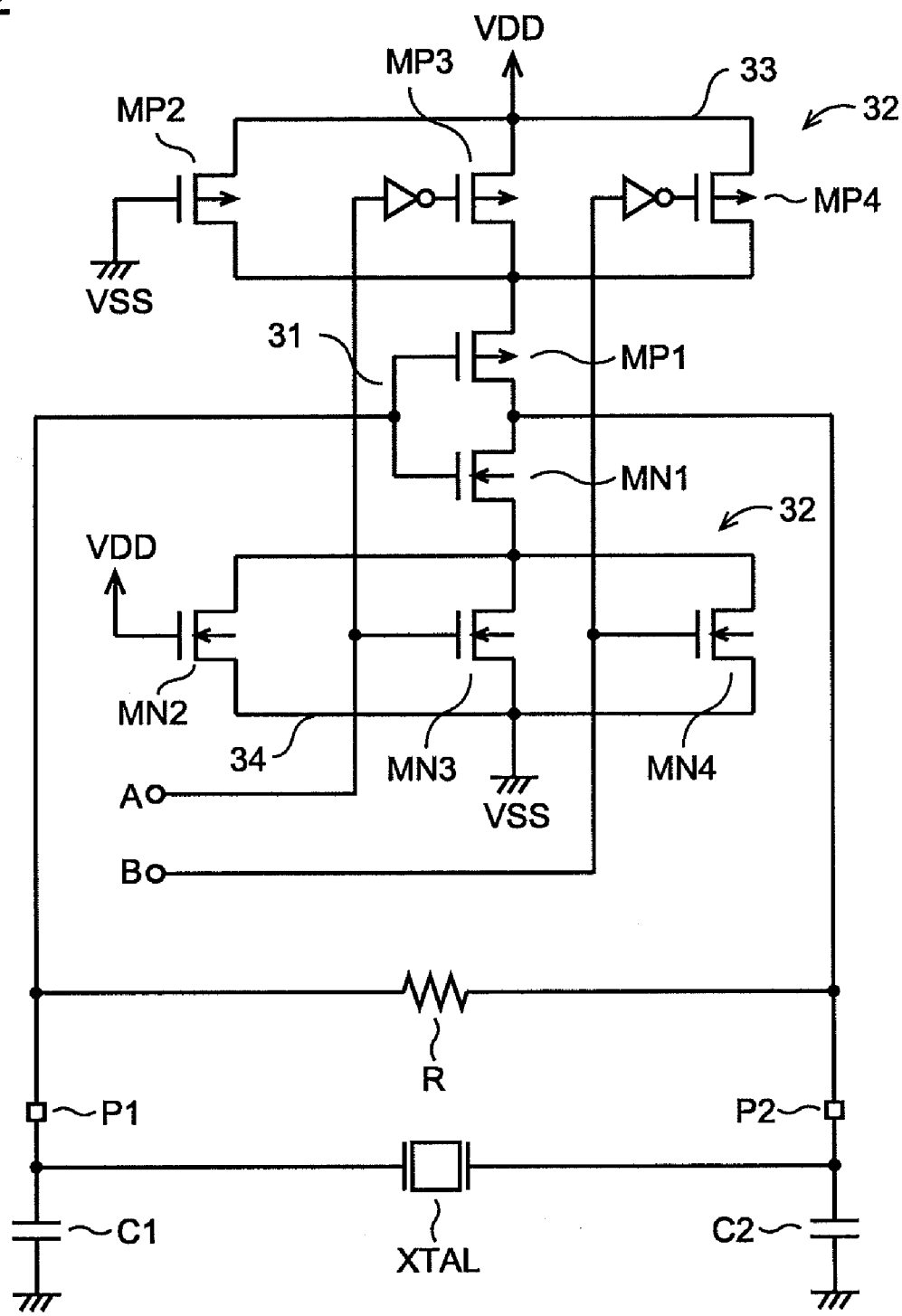
FIG. 2 is a circuit diagram showing a first quartz oscillator according to the embodiment of this invention.

An example of more detailed structure of the quartz oscillation 30 is explained referring to FIG. 2. The inverter 31 is a CMOS inverter made of a P channel type MOS transistor MP1 and an N channel type MOS transistor MN1 connected in series, as shown in FIG. 2. The inverter 31, which is used as an inverting amplifier, is not limited to the CMOS inverter, and may be made of another type of inverting amplifier.

P channel type MOS transistors MP2, MP3 and MP4 (an example of switching devices) are connected in parallel to each other between a source of the P channel type MOS transistor MP1 and a power supply line 33 that is to supply the power supply electric potential VDD. The P channel type MOS transistor MP2 is always set to an ON state by applying the ground electric potential VSS to a gate of the P channel MOS transistor MP2. An inverted signal of the first impedance control signal A is applied to a gate of the P channel type MOS transistor MP3. An inverted signal of the second impedance control signal B is applied to a gate of the P channel type MOS transistor MP4.

Also, N channel type MOS transistors MN2, MN3 and MN4 (an example of switching devices) are connected in parallel to each other between a source of the N channel type MOS transistor MN1 and a ground line 34 that is to supply the ground electric potential VSS. The N channel type MOS transistor MN2 is always set to an ON state by applying the power supply electric potential VDD to a gate of the N channel MOS transistor MN2. The first impedance control signal A is applied to a gate of the N channel type MOS transistor MN3. The second impedance control signal B is applied to a gate of the N channel type MOS transistor MN4.

An impedance between a source and a drain of each of the always turned ON transistors, that are the P channel type MOS transistor MP2 and the N channel type MOS transistor MN2, is set to a high impedance by reducing its transistor size (reducing a ratio of its channel width to its channel length).

An impedance between a source and a drain of each of the transistors turned on and off by the first impedance control signal A, that are P channel type MOS transistor MP3 and the N channel type MOS transistor MN3, is set to a low impedance by increasing its transistor size (increasing a ratio of its channel width to its channel length).

An impedance between a source and a drain of each of the transistors turned on and off by the second impedance control signal B, that are the P channel type MOS transistor MP4 and the N channel type MOS transistor MN4, is set to a medium impedance by setting its transistor size smaller (setting a ratio of its channel width to its channel length smaller) than that of each of the transistor MP3 and MN3, respectively.

With the structure described above, the power supply impedance of the inverter 31 becomes the low impedance when the first impedance control signal A is at the H level and the second impedance control signal B is at the L level, because only the transistors MP2, MN2, MP3 and MN3 are turned on. That is, an impedance between the inverter 31 and the power supply line 33 and an impedance between the inverter 31 and the ground line 34 are reduced. The power supply impedance in this context includes the impedance between the inverter 31 and the power supply line 33 and the impedance between the inverter 31 and the ground line 34.

The power supply impedance of the inverter 31 becomes the medium impedance when the second impedance control signal B is at the H level and the first impedance control signal A is at the L level, because only the transistors MP2, MN2, MP4 and MN4 are turned on. When both the first impedance control signal A and the second impedance control signal B are at the L level, the power supply impedance of the inverter 31 becomes the high impedance because only the transistors MP2 and MN2 are turned on.

The power supply impedance switching unit 32 is provided on both sides of the inverter 31, that is, on the side of the power supply electric potential VDD (side of the source of the P channel type MOS transistor MP1) and on the side of the ground electric potential VSS (side of the source of the N channel type MOS transistor MN1) in the quartz oscillator 30 shown in FIG. 2.

Figure 3:
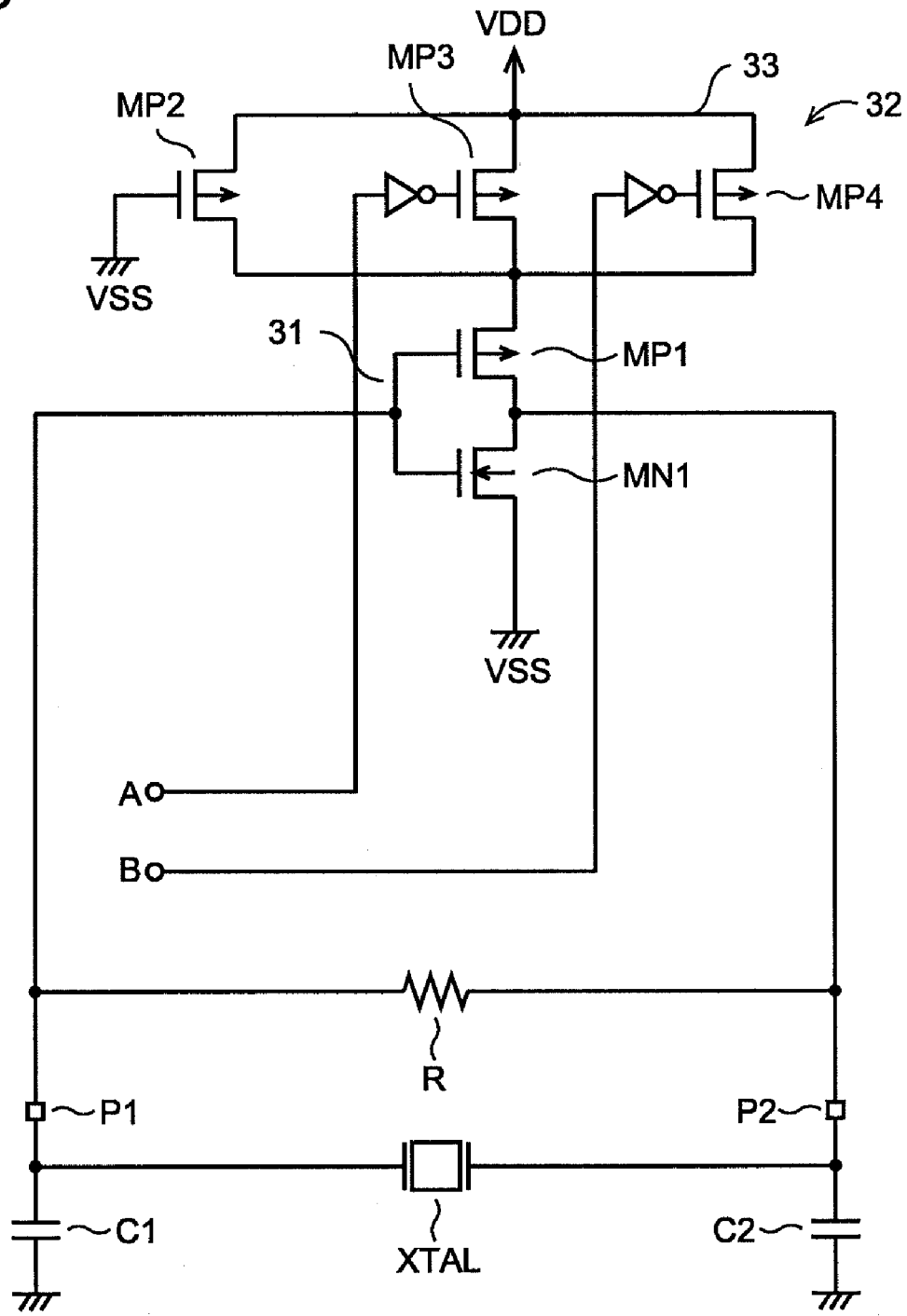
FIG. 3 is a circuit diagram showing a second quartz oscillator according to the embodiment of this invention.
Figure 4:
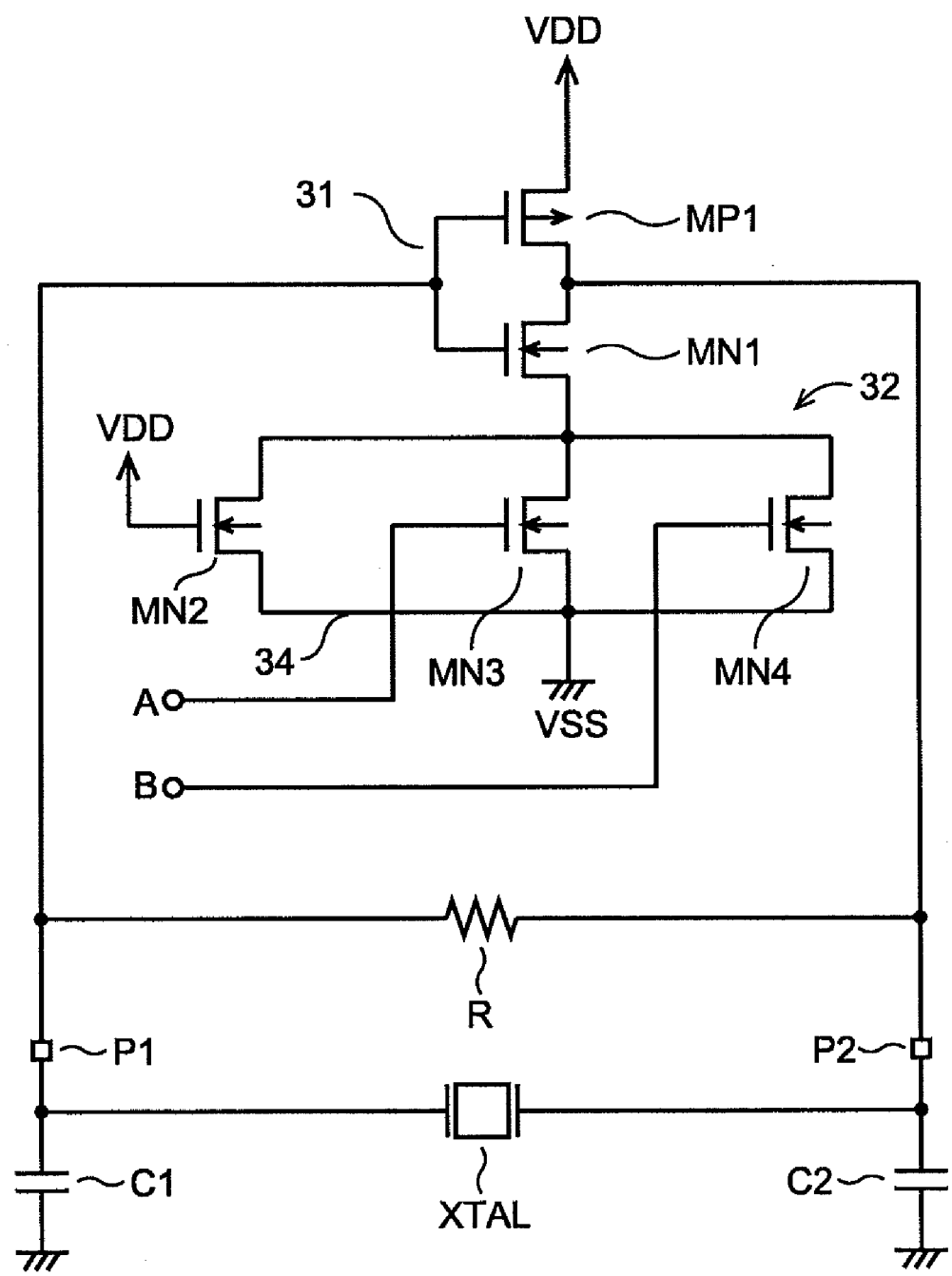
FIG. 4 is a circuit diagram showing a third quartz oscillator according to the embodiment of this invention.

Not limited to the structure described above, the power supply impedance switching unit 32 may be provided only on the side of the power supply electric potential VDD of the inverter 31 (between the source of the P channel type MOS transistor MP1 and the power supply line 33), as shown in FIG. 3. Or, the power supply impedance switching unit 32 may be provided only on the side of the ground electric potential VSS of the inverter 31 (between the source of the N channel type MOS transistor MN1 and the ground line 34), as shown in FIG. 4. The transistor constituting the power supply impedance switching unit 32 to vary the power supply impedance are not limited to the MOS transistors described above, and may be made of switching devices such as bipolar transistors.

Operations of the microcomputer described above are summarized in Table 1 and described below.

TABLE 1

| Operation Mode | Signal | | | | | Power Supply Impedance |
|---|---|---|---|---|---|---|
| | S1 | S2 | S3 | A | B | |
| High Speed | H | L | L | H | L | Low |
| Medium Speed | L | H | L | L | H | Medium |
| Low Speed | L | L | H | L | L | High |
| Standby | L | L | L | L | L | High |

When the high speed operation mode is selected, the control signal S1 turns to the H level (The control signals S2 and S3 are at the L level.), and the high frequency oscillator 11 is put into operation. The microcomputer operates based on a high frequency system clock derived from the clock generated by the high frequency oscillator 11. At that time, the first impedance control signal A turns to the H level in response to the control signal S1, and the power supply impedance of the quartz oscillator 30 is set to the low impedance.

As a result, even when a large noise is caused by the high frequency oscillator 11, a disturbance in a waveform of the clock due to the noise is suppressed and the timepiece circuit 20 makes normal operation since the power supply impedance of the quartz oscillator 30 is set to the low impedance.

Although the power consumption of the quartz oscillator 30 is increased in this case, the increase in the power consumption of the quartz oscillator 30 does not cause a problem to the microcomputer as a whole, since the power consumption of the quartz oscillator 30 is negligibly small compared with the power consumption of the microcomputer in the high speed mode in which the high frequency oscillator 11 is in operation. This is because the quartz oscillator 30 consumes only several microamperes or less, while the high frequency oscillator 11 consumes approximately several milliamperes in microcomputers in general.

When the medium speed operation mode is selected, the control signal S2 turns to the H level (The control signals S1 and S3 are at the L level.), and the medium frequency oscillator 12 is put into operation. The microcomputer operates based on a medium frequency system clock derived from the clock generated by the medium frequency oscillator 12. At that time, the second impedance control signal B turns to the H level in response to the control signal S2, and the power supply impedance of the quartz oscillator 30 is set to the medium impedance. As a result, even when a medium noise is caused by the medium frequency oscillator 12, the disturbance in the waveform of the clock due to the noise is suppressed and the timepiece circuit 20 makes normal operation since the power supply impedance of the quartz oscillator 30 is set to the medium impedance.

When the low speed operation mode is selected, the control signal S3 turns to the H level and the low frequency oscillator 13 is put into operation. The microcomputer operates based on a low frequency system clock derived from the clock generated by the low frequency oscillator 13. A noise caused by the low frequency oscillator 13 is small, and the malfunctioning of the quartz oscillator 30 is rarely caused. In this case, both the first and second impedance control signals A and B are at the L level and the power supply impedance of the quartz oscillator 30 is set to the high impedance because both the control signals S1 and S2 are at the L level. By doing so, the power consumption is suppressed as much as possible.

When the microcomputer is in a waiting period (standby period), the control signals S1, S2 and S3 are set at the L level to halt all the operations of the high frequency oscillator 11, the medium frequency oscillator 12 and the low frequency oscillator 13. In this case, the first and second impedance control signals A and B are at the L level, and the power supply impedance of the quartz oscillator 30 is set to the high impedance.

Because no noise is caused by the high frequency oscillator 11, the medium frequency oscillator 12 or the low frequency oscillator 13, there is no possibility of malfunctioning of the quartz oscillator 30 even when the power supply impedance of the quartz oscillator 30 is set to the high impedance. Since the power supply impedance is set to the high impedance in this case, the operation current of the inverter 31 is suppressed to reduce the current consumption of the quartz oscillator 30 to less than one microampere, for example. As a result, the power consumption of the microcomputer is suppressed to the minimum.

Other than the operation mode selected by the operation mode switching unit 15, the power supply impedance of the quartz oscillator 30 can be also controlled with the control signals S6 and S7 stored in the power supply impedance control register 19. When the control signal S6 is at the H level, the first impedance control signal A is turned to the H level. When the control signal S7 is at the H level, the second impedance control signal B is turned to the H level.

Thus, the power supply impedance of the quartz oscillator 30 may be reduced by setting corresponding data in the power supply impedance control register 19, in case there is a possibility of malfunctioning of the quartz oscillator 30 due to the noise caused by the low frequency oscillator 13, for example. Also, when there is a possibility of malfunctioning of the quartz oscillator 30 due to an external noise while the microcomputer is in the waiting period (standby period), the power supply impedance of the quartz oscillator 30 may be reduced by setting the corresponding data in the power supply impedance control register 19.

There are provided three oscillators, which are the high frequency oscillator 11, the medium frequency oscillator 12 and the low frequency oscillator 13, to generate the system clocks in the embodiment described above. Not limited to the above, this invention may be applied to other cases where only one oscillator (one out of the high frequency oscillator 11, the medium frequency oscillator 13 and the low frequency oscillator 13, for example), or two oscillators (two out of the high frequency oscillator 11, the medium frequency oscillator 13 and the low frequency oscillator 13, for example) are provided. Also, this invention may be applied to the case where four oscillators to generate the system clocks are provided (In addition to the high frequency oscillator 11, the medium frequency oscillator 13 and the low frequency oscillator 13, another oscillator to generate a clock that is different in oscillation frequency from the other three clocks is added, for example.).

Also, this invention may be applied to the case in which the microcomputer is provided with a ceramic filter oscillator (CF oscillator) to generate a clock to drive a timer or the like in addition to the oscillators for the system clocks (the high frequency oscillator 11, the medium frequency oscillator 13 and the low frequency oscillator 13 in the embodiment).

When the ceramic filter oscillator is in operation, the power supply impedance of the quartz oscillator 30 is reduced to improve a noise tolerance. When the ceramic filter oscillator is not in operation, on the other hand, the power supply impedance of the quartz oscillator 30 is increased to reduce the power consumption. Because the ceramic filter oscillator causes a large noise, this invention exerts a substantial effect.

This invention is suitable for applying to a microcomputer, especially to a single chip microcomputer integrating the system shown in FIG. 1 on a single chip excluding the quartz resonator XTAL in the quartz oscillator 30, the ceramic filter in the CF oscillator or the like. Not limited to the above, this invention may be applied extensively to electronic circuits (semiconductor integrated circuits, for example) having a plurality of oscillators different in oscillation frequency from each other.

According to the embodiment of this invention, it is made possible to reduce the power consumption of the electronic circuit (microcomputer, for example) while preventing the malfunctioning of the low frequency oscillator by appropriately setting the power supply impedance of the low frequency oscillator corresponding to the operation mode.

What is claimed is:

1. An electronic circuit comprising:
a first oscillator generating a first clock, a power supply impedance of the first oscillator being configured to be variable and controllable;
a second oscillator generating a second clock, a frequency of the second clock being higher than a frequency of the first clock;
a third oscillator generating a third clock, a frequency of the third clock being higher than the frequency of the second clock; and
a control circuit setting the power supply impedance of the first oscillation circuit to a high impedance when the second and the third oscillators are halted, setting the power supply impedance of the first oscillator to a medium impedance when the second oscillator is in operation and the third oscillator is halted, and setting the power supply impedance of the first oscillator to a low impedance when the third oscillator is in operation and the second oscillator is halted.

2. The electronic circuit of claim 1, wherein the control circuit comprises a register to store a control signal to control the power supply impedance of the first oscillator and controls the power supply impedance of the first oscillator based on the control signal stored in the register.

3. The electronic circuit of claim 2, further comprising an operation mode switching circuit that outputs an operation mode switching signal to put the second oscillator or the third oscillator into operation, wherein the control circuit controls the power supply impedance of the first oscillator based on the operation mode switching signal.

4. The electronic circuit of claim 1, further comprising an operation mode switching circuit that outputs an operation mode switching signal to put the second oscillator or the third oscillator into operation, wherein the control circuit controls the power supply impedance of the first oscillator based on the operation mode switching signal.

5. The electronic circuit of claim 1, wherein the first oscillator comprises a quartz oscillator.

6. The electronic circuit of claim 5, wherein the first oscillator comprises a first terminal, a second terminal, a quartz resonator and an amplifier connected between the first terminal and the second terminal, a power supply line to provide the amplifier with a power supply electric potential, a ground line to provide the amplifier with a ground electric potential, and a power supply impedance switching unit comprising switching devices to vary the power supply impedance and disposed between the power supply line and a power supply terminal of the amplifier or between the ground line and a ground terminal of the amplifier, the switching devices in the power supply impedance switching unit being turned on or off by the control circuit.

7. The electronic circuit of claim 1, wherein the second oscillator comprises an RC oscillator or a ceramic filter oscillator.

* * * * *